US012727425B2

(12) United States Patent
Kim et al.

(10) Patent No.: US 12,727,425 B2
(45) Date of Patent: Sep. 1, 2026

(54) CHIP PICK-UP HEAD, AND CHIP DETACHMENT APPARATUS AND METHOD USING THE PICK-UP HEAD

(71) Applicant: SAMSUNG ELECTRONICS CO., LTD., Suwon-si (KR)

(72) Inventors: Minsung Kim, Suwon-si (KR); Youngsoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 274 days.

(21) Appl. No.: 18/318,239

(22) Filed: May 16, 2023

(65) Prior Publication Data

US 2024/0087923 A1 Mar. 14, 2024

(30) Foreign Application Priority Data

Sep. 14, 2022 (KR) ........................ 10-2022-0115806

(51) Int. Cl.
*H01L 21/67* (2006.01)
*H01L 21/683* (2006.01)

(52) U.S. Cl.
CPC .... *H01L 21/67132* (2013.01); *H01L 21/6838* (2013.01)

(58) Field of Classification Search
CPC ........... H01L 21/67132; H01L 21/6714; H01L 21/67721; H01L 21/6836; H01L 21/6838; H01L 2221/68327; H01L 2221/6839; H01L 2224/7999; H01L 2224/98; H01L 24/799; H01L 24/98; H05K 13/0409
USPC ........ 156/60, 73.6, 701, 705, 706, 707, 709, 156/714, 750, 754, 755, 758, 764, 716, 156/765; 438/464, 458
See application file for complete search history.

(56) References Cited

U.S. PATENT DOCUMENTS 6,010,919 A * 1/2000 Matsuhiro ......... H01L 21/31138 257/E21.256
6,045,026 A * 4/2000 Hembree ............... B23K 20/10 228/110.1
6,321,973 B1 * 11/2001 Minamitani ...... H01L 21/67138 257/E21.511
7,757,742 B2 7/2010 Cheung et al.
10,756,045 B2 * 8/2020 Ha .......................... H01L 24/81
(Continued)

FOREIGN PATENT DOCUMENTS

JP 2003264203 9/2003
JP 2004356242 12/2003
(Continued)

OTHER PUBLICATIONS

First Office Action issued Jan. 13, 2026 in corresponding Korean Patent Application No. 10-2022-0115806.

*Primary Examiner* — Philip C Tucker
(74) *Attorney, Agent, or Firm* — Morgan, Lewis & Bockius LLP

(57) ABSTRACT

A chip pick-up head includes a collet in contact with an upper surface of a chip of a diced wafer. The chip pick-up head detaches and picks up the chip from an adhesive film. The chip pick-up head further includes a head part coupled to the collet, a vibration transfer rod coupled to the head part and configured to transfer a vibration to the head part and the collet, and a vibration generator coupled to the vibration transfer rod and configured to generate the vibration.

18 Claims, 17 Drawing Sheets

(56) References Cited

U.S. PATENT DOCUMENTS

| | | | | |
|---|---|---|---|---|
| 2003/0150108 | A1* | 8/2003 | Higashi | H01L 24/75 29/840 |
| 2006/0252233 | A1* | 11/2006 | Honma | H01L 21/67132 438/464 |
| 2007/0275544 | A1* | 11/2007 | Maki | H10P 72/0442 438/464 |
| 2018/0055484 | A1* | 3/2018 | Kim | A61B 8/4272 |
| 2020/0152091 | A1* | 5/2020 | Haga | G09B 23/285 |
| 2021/0066112 | A1 | 3/2021 | Jeong | |
| 2021/0143064 | A1* | 5/2021 | Harada | H10P 54/00 |
| 2024/0087923 | A1* | 3/2024 | Kim | H01L 21/6838 |

FOREIGN PATENT DOCUMENTS

| | | | |
|---|---|---|---|
| JP | 3832395 | | 10/2006 |
| JP | 2014-110262 | A | 6/2014 |
| KR | 10-2004-0086359 | A | 10/2004 |
| KR | 10-1322531 | | 10/2013 |
| KR | 10-2015-0090452 | A | 8/2015 |
| KR | 10-2256219 | | 5/2021 |
| KR | 10-2294889 | | 8/2021 |
| KR | 10-2366826 | | 2/2022 |

* cited by examiner

Scom.
22
H th
H2
24
H1
H0
222
224
210
220

| Comparative Evaluation On Non-Separation OF Chips | | | Evaluation Results | | | | | |
|---|---|---|---|---|---|---|---|---|
| | | | DIE Thickness 60µmT | | | DIE Thickness 35µmT | | |
| | Ejector Height | Ejector Time | Number OF Samples | Number OF Undetached Chips | Non-Separation Ratio | Number OF Samples | Number OF Undetached Chips | Non-Separation Ratio |
| Exp1 | 250 µm | 240 msec | 200 | 29 | 15% | 200 | 88 | 44% |
| Exp2 | | 150 msec | 200 | 36 | 18% | 200 | 84 | 42% |
| Exp3 | | 150 msec | 200 | 21 | 11% | 200 | 22 | 11% |

FIG. 10A

| Comparative Evaluation On Crack OF Chips | | | Evaluation Results | | | | | |
|---|---|---|---|---|---|---|---|---|
| | | | DIE Thickness 60μmT | | | DIE Thickness 35μmT | | |
| | Ejector Height | Ejector Time | Number OF Samples | Number OF Crack Chips | Crack Generation Ratio | Number OF Samples | Number OF Crack Chips | Crack Generation Ratio |
| Exp1 | 600 μm | 240 msec | 200 | 21 | 11% | 200 | 1 | 1% |
| Exp2 | | 150 msec | 200 | 21 | 11% | 200 | 3 | 2% |
| Exp3 | | 150 msec | 200 | 7 | 4% | 200 | 0 | 0% |

CHIP PICK-UP HEAD, AND CHIP DETACHMENT APPARATUS AND METHOD USING THE PICK-UP HEAD

CROSS-REFERENCE TO RELATED APPLICATION

This application is based on and claims priority under 35 U.S.C. § 119 to Korean Patent Application No. 10-2022-0115806, filed on Sep. 14, 2022 in the Korean Intellectual Property Office, the disclosure of which is incorporated by reference herein in its entirety.

TECHNICAL FIELD

Embodiments of the inventive concept relate to an apparatus and method for detaching chips, and more particularly, to a chip pick-up head that picks up chips from a diced wafer, and an apparatus and method for detaching chips using the pick-up head.

DISCUSSION OF RELATED ART

Semiconductor devices may be formed by repeatedly performing a series of semiconductor processes on a silicon wafer substrate. A wafer on which semiconductor devices are formed may be individualized into a plurality of chips by a dicing process or a singulation process. Individualized chips may be mounted on a substrate such as, for example, a lead frame, a printed circuit board, or a semiconductor wafer, by a die attach process. The die attach process may include a chip pick-up process and a chip bonding process. The chip pick-up process may refer to a process of picking up and detaching chips of a diced wafer from an adhesive film by using a chip detachment apparatus. The bonding process may refer to a process of attaching the picked-up chips to a substrate.

SUMMARY

Embodiments of the inventive concept provides a chip pick-up head that stably detaches and picks up a chip from an adhesive film in a die attach process or a pick-up process, and a chip detachment apparatus and a chip detachment method using the pick-up head.

According to an embodiment of the inventive concept, a chip pick-up head includes a collet in contact with an upper surface of a chip of a diced wafer. The chip pick-up head detaches and picks up the chip from an adhesive film. The chip pick-up head further includes a head part coupled to the collet, a vibration transfer rod coupled to the head part and configured to transfer a vibration to the head part and the collet, and a vibration generator coupled to the vibration transfer rod and configured to generate the vibration.

According to an embodiment of the inventive concept, a chip detachment apparatus includes a wafer stage that supports a diced wafer attached to the adhesive film, an ejector stage positioned under the adhesive film and including a lifting block configured to push a chip to be picked up from the wafer, together with the adhesive film, and a chip pick-up head configured to detach and pick up the chip from the adhesive film by vacuum adsorption and vibration.

According to embodiment of the inventive concept, a chip detachment apparatus includes a wafer stage that supports a diced wafer attached to an adhesive film, an ejector stage positioned under the adhesive film and including a lifting block configured to push a chip to be picked up from the wafer, together with the adhesive film, and a chip pick-up head. The chip pick-up head includes a collet in contact with an upper surface of the chip, a head part coupled to the collet, and a vibration generator configured to generate a vibration and transfer the vibration to the head part and the collet.

According to an embodiment of the inventive concept, a method of detaching a chip to be picked up includes securing the chip, which is to be picked up from a diced wafer that is attached to an adhesive film, onto an ejector stage by vacuum adsorption, coupling a collet of a chip pick-up head to the chip by moving the chip pick-up head in a direction toward the chip, vibrating the chip pick-up head while lifting a lifting block of the ejector stage, and detaching and picking up the chip from the adhesive film by the chip pick-up head.

BRIEF DESCRIPTION OF THE DRAWINGS

The above and other features of the inventive concept will become more apparent by describing in detail embodiments thereof with reference to the accompanying drawings, in which:

FIG. 2 is a conceptual view schematically illustrating a chip detachment apparatus including a chip pick-up module, according to an embodiment;

FIGS. 9A and 9B are respectively a table and a graph showing non-separation ratios of chips in a comparative evaluation of the chip detachment method by the chip detachment apparatus of the comparative example and the chip detachment method by the chip detachment apparatus according to an embodiment of FIG. 1; and FIGS. 10A and 10B are respectively a table and a graph showing crack generation ratios of chips in a comparative evaluation of the chip detachment method by the chip detachment apparatus of the comparative example and the chip detachment method by the chip detachment apparatus in FIG. 1.

DETAILED DESCRIPTION OF THE EMBODIMENTS

Figure 1:
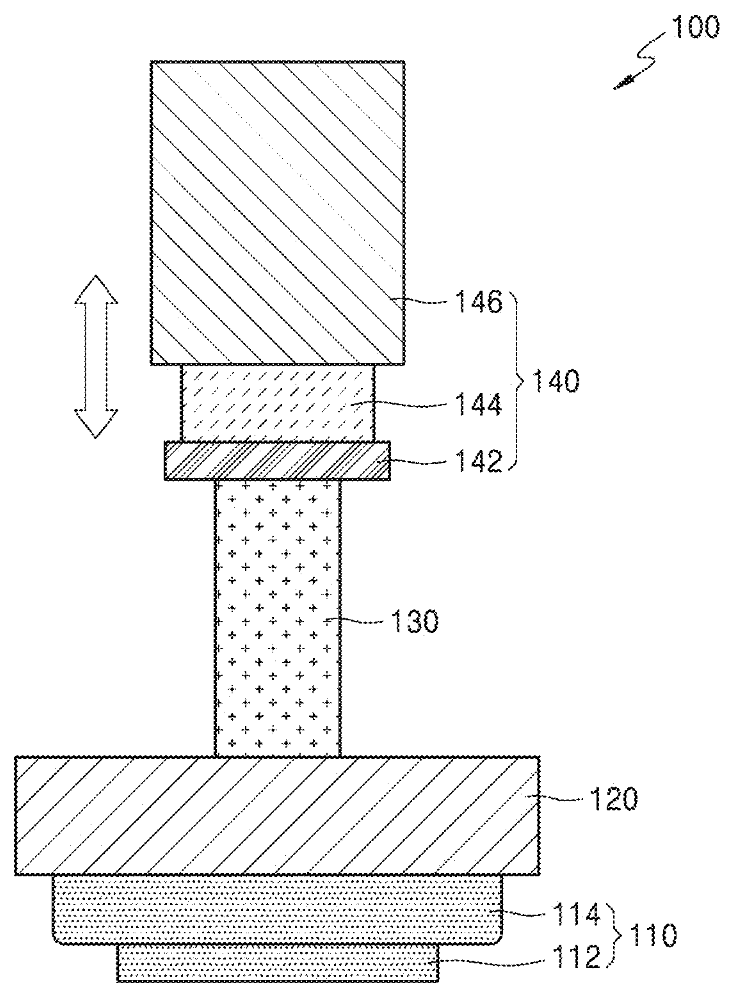
FIG. 1 is a side view of a chip pick-up module according to an embodiment.

Embodiments of the inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to example embodiments, the parameter may be exactly the certain value or approximately the certain value within a measurement error as would be understood by a person having ordinary skill in the art. Other uses of these terms and similar terms to describe the relationships between components should be interpreted in a like fashion.

It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art.

FIG. 1 is a side view of a chip pick-up module according to an embodiment.

Referring to FIG. 1, a chip pick-up head 100 according to an embodiment may include a collet 110, a head part 120, a vibration transfer rod 130 and a vibration generator 140. The chip pick-up head 100 may include a device that picks up a chip 22 from a diced wafer 20 attached to an adhesive film 24 (see FIG. 2).

For example, according to an embodiment, the collet 110 is in contact with an upper surface of the chip 22 of the diced wafer 20. The chip pick-up head 100 detaches and picks up the chip 22 from the adhesive film 24. The head part 120 is coupled to the collet 110. The vibration transfer rod 130 is coupled to the head part 120 and transfers a vibration(s) to the head part 120 and the collet 110. The vibration generator 140 is coupled to the vibration transfer rod 130 and generates the vibration(s).

The collet 110 may be arranged at a lowermost portion of the chip pick-up head 100. The collet 110 may be positioned on a lower surface of the head part 120. The collet 110 may be detachable from the head part 120. For example, the collet 110 may be worn or deformed during several processes of picking up chips by the chip pick-up head 100. In such a case, a worn or deformed collet 110 may be detached from the head part 120 and be discarded, and a new collet 110 may be attached to the head part 120 and used.

The collet 110 may include a pad 112 and a collet body 114. When picking up the chip 22, a lower surface of the pad 112 may make contact with an upper surface of the chip 22. The pad 112 may be formed of an elastic material such as, for example, rubber or silicone. However, the material of the pad 112 is not limited to such materials.

The pad 112 may include a plurality of micro vacuum holes. For example, the vacuum holes may be arranged in at least one row along an outer portion of the pad 112. However, the arrangement position of the vacuum holes is not limited to the outer portion of the pad 112. When picking up the chip 22, vacuum suction may be performed on the chip 22 through the vacuum holes. In an embodiment, the vacuum holes of the pad 112 may be connected to a vacuum pump through a vacuum tube arranged in the collet body 114, the head part 120, the vibration transfer rod 130, and the vibration generator 140.

The collet body 114 may be coupled to the head part 120, and the pad 112 may be positioned on a lower surface of the collet body 114. A structure for attaching to or detaching the collet 110 from the head part 120 may be positioned on the collet body 114. In addition, the vacuum tube may be arranged in the collet body 114 and be connected to the vacuum holes of the pad 112.

As illustrated in FIG. 1, the size of the collet body 114 may be larger than that of the pad 112 and be smaller than that of the head part 120. Herein, the size of the collet body 114 may include an area, a width, and a diameter of the lower surface of the collet body 114. However, the size of the collet body 114 is not limited thereto. For example, according to embodiments, the size of the collet body 114 may be substantially the same as that of the head part 120.

The head part 120 may be a portion to which the collet 110 is coupled, and may have a size corresponding to the collet 110. For example, the size of the head part 120 may be larger than that of the collet body 114. In addition, a structure to which the collet 110 is detachable may be arranged on the lower surface of the head part 120. As described above, the vacuum tube may be arranged in the head part 120.

The vibration transfer rod 130 may have a cylindrical shape and may be integrally coupled to the head part 120. For example, as described in FIG. 1, the vibration transfer rod 130 may have a cylindrical shape extending in a direction substantially perpendicular to the upper surface of the head part 120. However, the shape of the vibration transfer rod 130 is not limited to a cylinder. For example, the vibration transfer rod 130 may have an elliptical columnar shape or a polygonal columnar shape according to embodiments. As described above, the vacuum tube extending in a vertical direction may be arranged in the head part 120.

According to embodiments, the vibration transfer rod 130 may be omitted. In such a case, the vibration generator 140 may be directly coupled to an upper portion of the head part 120. In addition, the vibration generated by the vibration generator 140 may be directly transferred to the head part 120 and the collet 110.

The vibration generator 140 may be coupled to an upper portion of the vibration transfer rod 130. The vibration generator 140 may include a coupler 142, a vibration generating unit 144, and a cover 146. The coupler 142 may be a portion to which the vibration transfer rod 130 is coupled. The vibration generating unit 144 may be firmly coupled to the vibration transfer rod 130 by the coupler 142, and thus, the vibration generated from the vibration generating unit 144 may be efficiently transferred to the vibration transfer rod 130. When the vibration transfer rod 130 is omitted, the coupler 142 may be coupled to the head part 120.

The vibration generating unit 144 may be a device that electrically generates vibration. For example, the vibration generating unit 144 may include an actuator that generates vibration. The vibration generating unit 144 may include, for example, a voice coil motor, a piezo motor, an ultrasonic vacuum motor, and an eccentric type motor. However, the motor applied to the vibration generating unit 144 is not limited to the aforementioned motors. The vibration generating unit 144 may generate vibration in a frequency range of about 1 Hz to about 500 Hz. However, the frequency of the vibration generated by the vibration generating unit 144 is not limited to the frequency range described above.

The vibration generating unit 144 may generate vibration in an extension direction of the vibration transfer rod 130. That is, the vibration generating unit 144 may generate vibration in a vertical direction substantially perpendicular to the upper surface of the head part 120 or a lower surface of the collet 110. For example, when the vibration generating unit 144 includes a voice coil motor, the vibration generating unit 144 may have a cylindrical shape around which a coil is wound, and when electric power is applied to the coil, the vibration generating unit 144 may be vibrated by Lorentz force in the vertical direction.

The cover 146 may have a cylindrical tube shape covering the vibration generating unit 144. When vibration is generated in the vibration generating unit 144, the vibration generating unit 144 may be vibrated between the inside and outside of the cover 146. That is, as illustrated by the thick double arrow in FIG. 1, the vibration generating unit 144 may vibrate in the vertical direction in such a manner that the vibration generating unit 144 moves downward to come out of the cover 146, and then moves upward again to enter the inside of the cover 146.

When vibration is generated in the vibration generating unit 144, the vibration is transmitted to the vibration transfer rod 130 through the coupler 142, and the vibration is then transferred to the head part 120 and the collet 110 through the vibration transfer rod 130. As a result, the head part 120 and the collet 110 may be vibrated. For example, the head part 120 and the collet 110 may be vibrated in one body in a vertical direction substantially perpendicular to the upper surface of the head part 120 or the lower surface of the collet 110.

In addition, the frequency of the vibration of the head part 120 and the collet 110 may be substantially the same as the frequency of the vibration generated by the vibration generating unit 144. For example, the vibration generating unit 144 may generate vibration in a frequency range of about 1 Hz to about 500 Hz, and as a result, the head part 120 and the collet 110 may vibrate at a frequency of about 1 Hz to about 500 Hz according to the vibration of the vibration generating unit 144.

The chip pick-up head 100 according to an embodiment may include the vibration generating unit 144, and the head part 120 and the collet 110 may be vibrated in the vertical direction by the vibration generated from the vibration generating unit 144. Accordingly, in the process of detaching the chip 22 from the adhesive film 24 and picking up the chip, the chip pick-up head 100 of an embodiment may reduce stresses applied to the chip 22 and minimize or reduce cracks in the chip 22 by vibrating the head part 120 and the collet 110 in the vertical direction by the vibration generating unit 144. As a result, the chip pick-up head 100 of an embodiment stably detaches and picks up the chip 22 from the adhesive film 24, and thus, the reliability of the chip 22 and the reliability of the semiconductor package including the chip 22 may be increased.

Figure 2:
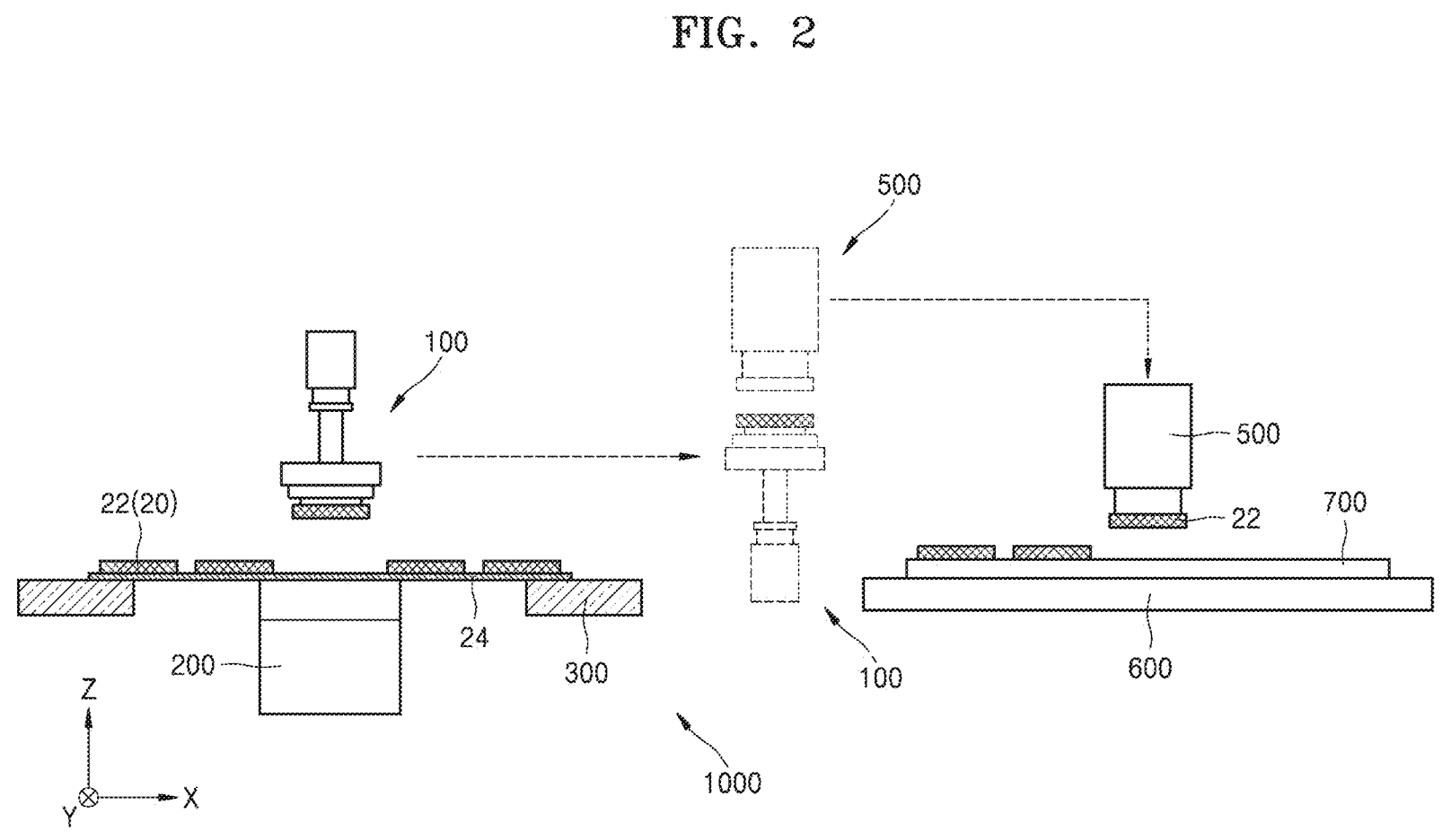

FIG. 2 is a conceptual view schematically illustrating a chip detachment apparatus including a chip pick-up module, according to an embodiment.

In FIG. 2, the chip detachment apparatus is described in detail together with reference to FIG. 1. For convenience of explanation, a further description of components and technical aspects previously described with reference to FIG. 1 are only briefly described or omitted.

Referring to FIG. 2, the chip detachment apparatus 1000 according to an embodiment may perform a die attach process together with a chip bonding head 500. The die attach process may include a chip pick-up process and a chip bonding process. That is, the die attach process may be a single process in which the chip pick-up process for picking up the chip 22 from the diced wafer 20 and the chip bonding process for bonding the chip 22 onto a substrate 700, such as, for example, a lead frame, a printed circuit board, a semiconductor wafer, etc., are sequentially performed. The chip detachment apparatus 1000 including the chip pick-up head 100 may be used in the chip pick-up process. In addition, the chip bonding head 500 may be used in the chip bonding process.

FIG. 2 schematically illustrates the entire chip attach process according to an embodiment. Accordingly, the chip detachment apparatus 1000 is illustrated in FIG. 2 together with the chip bonding head 500. For example, as shown by a dotted line between the chip detachment apparatus 1000 and the substrate 700, the chip bonding head 500 may receive the chip 22 from the chip pick-up head 100 and bond the chip 22 onto the substrate 700. When receiving the chip 22 by the chip bonding head 500, the chip pick-up head 100 may be turned up in such a manner that the chip 22 faces upward, and the chip bonding head 500 may adsorb the chip 22 by a vacuum pressure applied through a collet 510 in FIG. 5D. In such a case, the vacuum adsorption may be released in the chip pick-up head 100. The substrate 700 may be positioned on the substrate stage 600.

The chip detachment apparatus 1000 according to an embodiment may include the chip pick-up head 100, an ejector stage 200, and a wafer stage 300. The chip pick-up head 100 is the same as described in the description of FIG. 1.

The ejector stage 200 may be positioned below the adhesive film 24. For example, the ejector stage 200 may be positioned below the adhesive film 24 where the chip 22 to be picked up is located. The ejector stage 200 may include an ejector or a lifting block 220 (see FIGS. 3A and 3B). When detaching and picking up the chips 22, the ejector stage 200 may push the picked-up chips 22 together with the adhesive film 24 upward by using the lifting block 220. The structure of the ejector stage 200 is described in further detail below with reference to FIGS. 3A and 3B.

The wafer stage 300 may support a wafer 20. The wafer 20 may include multiple chips 22 detached by a dicing process. The chips 22 may be attached to the adhesive film 24. That is, the chips 22 may be maintained in the shape of the wafer 20 by being attached to the adhesive film 24, although the chips 22 are detached from each other on the adhesive film 24. The adhesive film 24 may be, for example, a dicing tape that is used in a dicing process for dicing the wafer 20. For example, the front surfaces of the chips 22 may face upward, and the rear surfaces of the chips 22 may be attached onto the adhesive film 24.

The adhesive film 24 may be installed on a circular ring-shaped mount frame included in the wafer stage 300. In addition, a support ring for supporting the adhesive film 24 may be positioned on the wafer stage 300. For example, the support ring may support the adhesive film 24 between the chips 22 and the mount frame. A plurality of clamps holding and fixing the mount frame may be arranged on the wafer stage 300. The clamps may be moved downward by the clamp driver. The adhesive film 24 may be expanded by the movement of the clamps, and thus, the chips 22 may be efficiently picked up by the chip pick-up head 100.

According to embodiments, the chip detachment apparatus 1000 may include a head driver that drives the chip pick-up head 100 and an ejector driver that drives the ejector stage 200. The head driver may include a head horizontal driver that moves the chip pick-up head 100 in a first direction (X direction) and a second direction (Y direction) on a horizontal plane, and a head vertical driver that moves the chip pick-up head 100 in a third direction (Z direction) substantially perpendicular to the horizontal plane. In addition, the ejector driver may include an ejector horizontal driver that moves the ejector stage 200 in the first direction (X direction) and the second direction (Y direction) on the horizontal plane, and an ejector vertical driver that moves the ejector stage 200 in the third direction (Z direction) substantially perpendicular to the horizontal plane.

According to embodiments, the chip detachment apparatus 1000 may include a sensor that detects whether the chip pick-up head 100 makes contact with the chip 22. In addition, the chip detachment apparatus 1000 may include a head turn driver that turns the chip pick-up head 100 over in such a manner that the chip 22 picked up by the chip pick-up head 100 is turned over and the rear surface of the chip 22 faces upward.

In the chip detachment apparatus 1000 of an embodiment, the chip pick-up head 100 may include the vibration generator 140. Thus, the die attach process or the chip pick-up process may be performed in a state that the vibration is applied to the head part 120 and the collet 110 by the vibration generator 140. Therefore, the stress to the chip 22 may be reduced, and the occurrence of a crack may be minimized or reduced in the chip 22. As a result, the chip detachment apparatus 1000 of an embodiment may detach and pick up the chip 22 from the adhesive film 24 with high stability. In addition, the chip bonding head 500 may receive the chip 22 from the chip pick-up head 100 and may bond and mount the chip 22 on the substrate 700. Accordingly, the reliability of the chip 22 and the reliability of a semiconductor package or an electronic product including the chip 22 may be increased.

According to an embodiment, the wafer stage 300 supports a diced wafer 20 attached to the adhesive film 24. The ejector stage 200 is positioned under the adhesive film 24 and includes the lifting block 220, which is configured to push the chip 22 to be picked up from the wafer 20 together with the adhesive film 24. The chip pick-up head 100 is configured to detach and pick up the chip 22 from the adhesive film 24 by vacuum adsorption and vibration.

Figure 3A:
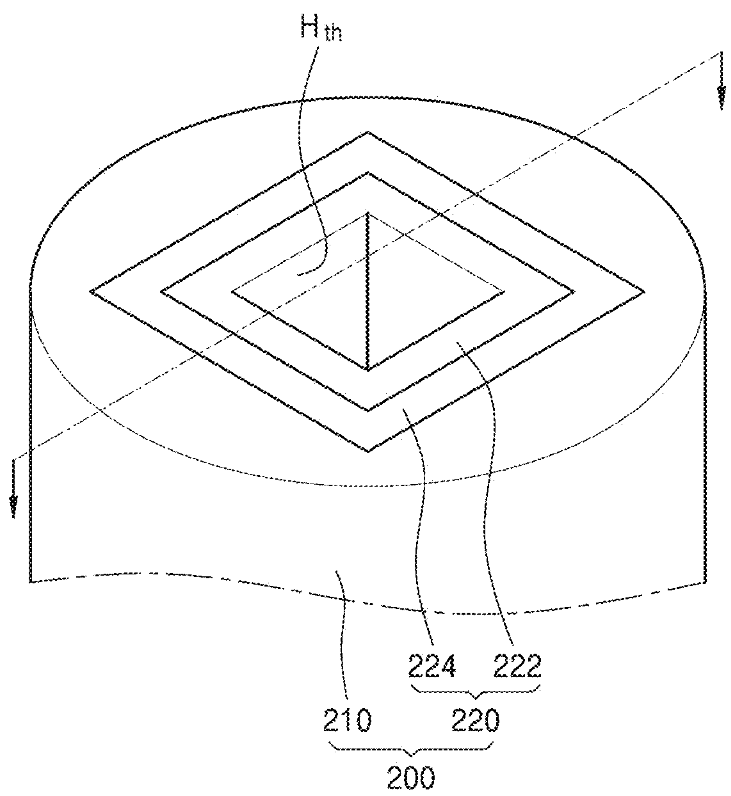
FIGS. 3A and 3B are a perspective view and a cross-sectional view, respectively, of the ejector stage in the chip detachment apparatus of FIG. 2.
Figure 3B:
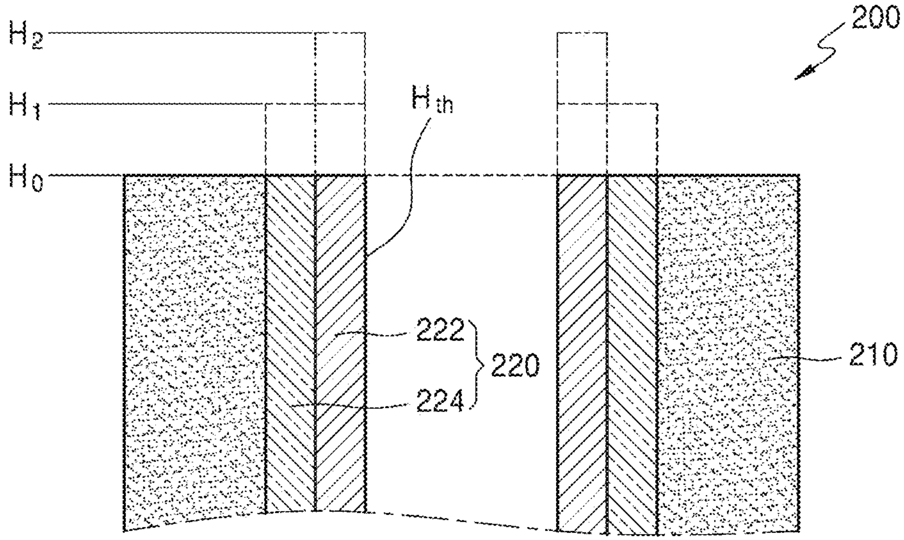

FIGS. 3A and 3B are a perspective view and cross-sectional view, respectively, of the ejector stage in the chip detachment apparatus of FIG. 2.

The ejector stage is described with reference to FIGS. 3A and 3B together with FIG. 2. For convenience of explanation, a further description of components and technical aspects previously described with reference to FIGS. 1 and 2 are briefly given or omitted.

Referring to FIGS. 3A and 3B, in the chip detachment apparatus 1000 according to an embodiment, the ejector stage 200 may include a base block 210 and the lifting block 220. In addition, a penetrating hole Hth may be provided in a central portion of the ejector stage 200. The ejector stage 200 may perform the vacuum adsorption and air blowing on the chip 22 to be picked up and the adhesive film 24 to which the chip 22 is located by using the penetrating hole Hth. As illustrated in FIG. 3A, a horizontal cross section of the penetrating hole Hth may have a quadrangular shape. However, the shape of the horizontal cross section of the penetrating hole Hth is not limited thereto. For example, the horizontal cross section of the penetrating hole Hth may be in the shape of a circle, an ellipse, or a polygon other than the quadrangle.

The lifting block 220 may also be referred to as an ejector. The lifting block 220 may have a shape surrounding the penetrating hole Hth. For example, the horizontal cross section of the lifting block 220 may have a quadrangular ring shape corresponding to the shape of the penetrating hole Hth. However, when the shape of the horizontal cross section of the penetrating hole Hth is changed, the shape of the horizontal cross section of the lifting block 220 may also be changed according to the changed shape of the horizontal cross section of the penetrating hole Hth. For example, when the horizontal cross section of the penetrating hole Hth has a circular shape, the horizontal cross section of the lifting block 220 may have a circular ring shape.

The lifting block 220 may include a first block 222 and a second block 224. The first block 222 may have a rectangular ring shape surrounding the penetrating hole Hth. In addition, the second block 224 may have a rectangular ring shape surrounding the first block 222. A base block 210 may be positioned outside the second block 224.

The ejector stage 200 may be moved by an ejector driver. For example, the ejector stage 200 may be moved on a horizontal plane by an ejector driver, to thereby move to a position under the chip 22 to be picked up. In addition, the lifting block 220 of the ejector stage 200 may move in a vertical direction substantially perpendicular to the horizontal plane by the ejector driver.

For example, referring to the movement of the ejector stage 200 in the vertical direction, when performing the detachment and pick-up process for the chip 22 to be picked up, the ejector stage 200 may move to the position under the chip 22 to be picked up. Thereafter, the entire lifting block 220 of the ejector stage 200, that is, the first block 222 and the second block 224, may be lifted from the base height H0, which is the height of an upper surface of the base block 210, to the first height H1. Then, the first block 222 may be lifted from the first height H1 to the second height H2.

The lifting of the lifting block 220 from the base height H0 to the first height H1 may be performed in a quasi-linear form. In addition, the lifting of the first block 222 from the first height H1 to the second height H2 may be continuously performed in a quasi-linear form. Herein, the quasi-linear form indicates that a graph of height over time is shown in a linear form with a regular ripple. An example of a regular ripple is shown in FIG. 7B, and refers to a slight, repeated variation occurring in an otherwise linear form. In addition, the term 'continuous' indicates that the lifting does not stop at the first height H1 and continues to lift. Accordingly, the first block 222 may be continuously lifted from the base height H0 to the second height H2 in the quasi-linear form. For example, the ripple may be caused by the vibration of the chip pick-up head 100 and the resulting vibration of the lifting block 220.

After the chip pick-up head 100 detaches and picks up the chip 22 from the adhesive film 24, the lifting block 220 may move down to the base height H0 by the reverse process. That is, the first block 222 may move down from the second height H2 to the first height H1, and the entire lifting block 220 may move down to the base height H0 from the first height H1. The moving down of the lifting block 220 may also be continuously performed in a linear form. However, the moving down of the lifting block 220 is not limited to the linear and continuous progress described above. The movement of the ejector stage 200 in the vertical direction is described in more detail below with reference to the graphs in FIGS. 6A to 7B.

Figure 4:
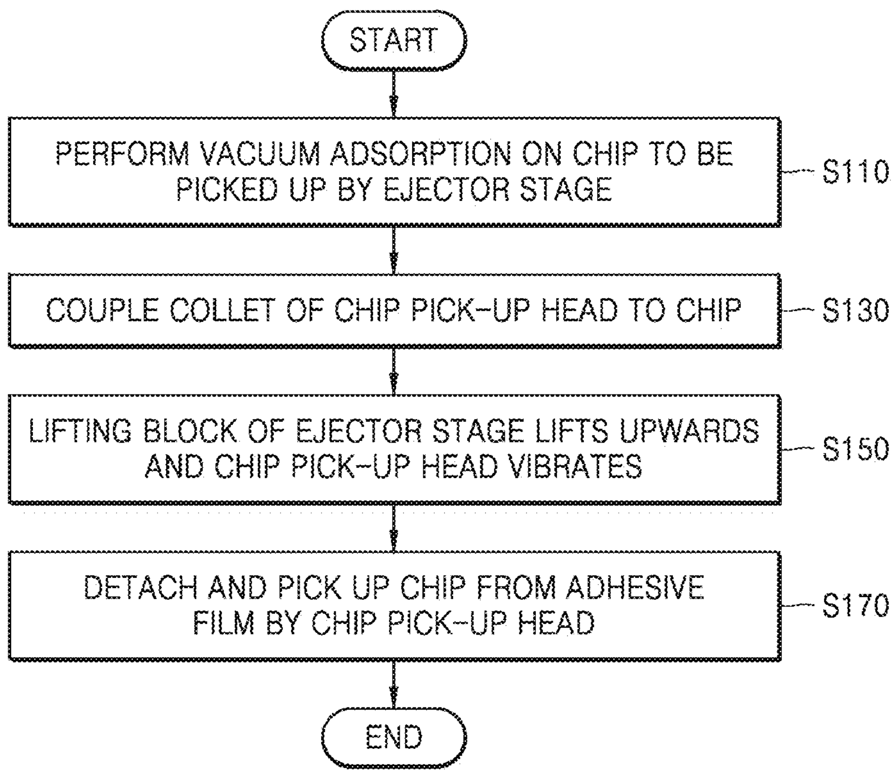
FIG. 4 is a flowchart schematically illustrating a method of detaching a chip by using the chip pick-up module, according to an embodiment.

FIG. 4 is a flowchart schematically illustrating a method of detaching a chip by using the chip pick-up module, according to an embodiment.

FIGS. 5A to 5D are conceptual views illustrating each operation of the method of detaching a chip in FIG. 4, according to an embodiment.

The method of detaching the chip is described with reference to FIGS. 4 to 5D together with FIG. 3. For convenience of explanation, a further description of components and technical aspects previously described with reference to FIGS. 1 to 3 are only briefly described or omitted.

Referring to FIG. 4, in a method of detaching a chip by using the chip pick-up module of an embodiment (hereinafter, referred to as the 'chip detachment method'), vacuum adsorption may be firstly performed on the chip 22 to be picked up by the ejector stage 200 (S110). The vacuum adsorption may be performed through the penetrating hole Hth of the ejector stage 200. For example, the vacuum adsorption is not performed directly on the chip 22, but rather, may be performed on a corresponding portion of the adhesive film 24 on which the chip 22 is positioned.

Figure 5A:
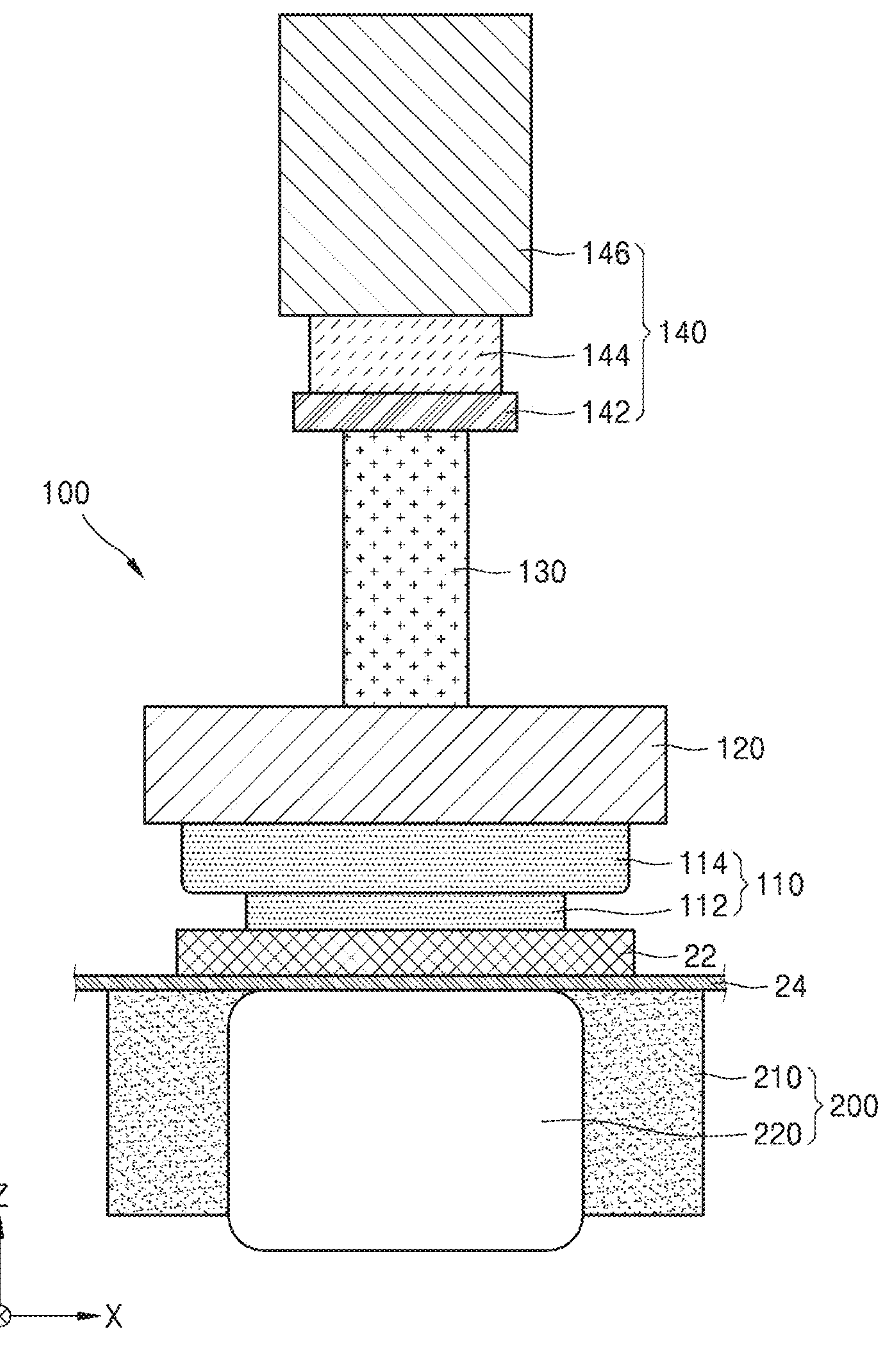
FIGS. 5A to 5D are conceptual views illustrating each operation of the method of detaching a chip in FIG. 4, according to an embodiment.

Referring to FIGS. 4 and 5A, thereafter, the chip pick-up head 100 may move down, and the collet 110 of the chip pick-up head 100 may be coupled to the chip 22 (S130). In addition, the collet 110 performs vacuum adsorption on the chip 22 through the vacuum hole. Accordingly, the chip 22 may be adsorbed to the collet 110 by vacuum pressure. For example, in FIGS. 5A to 5C, for convenience of illustration, the lifting block 220 is not shown as the detached first block 222 and second block 224, and the first block 222 and second block 224 are integrally shown as the lifting block 220. In addition, in FIGS. 5B and 5C, for convenience of illustration, the lifting block 220 is shown to perform just one lifting.

Figure 5B:
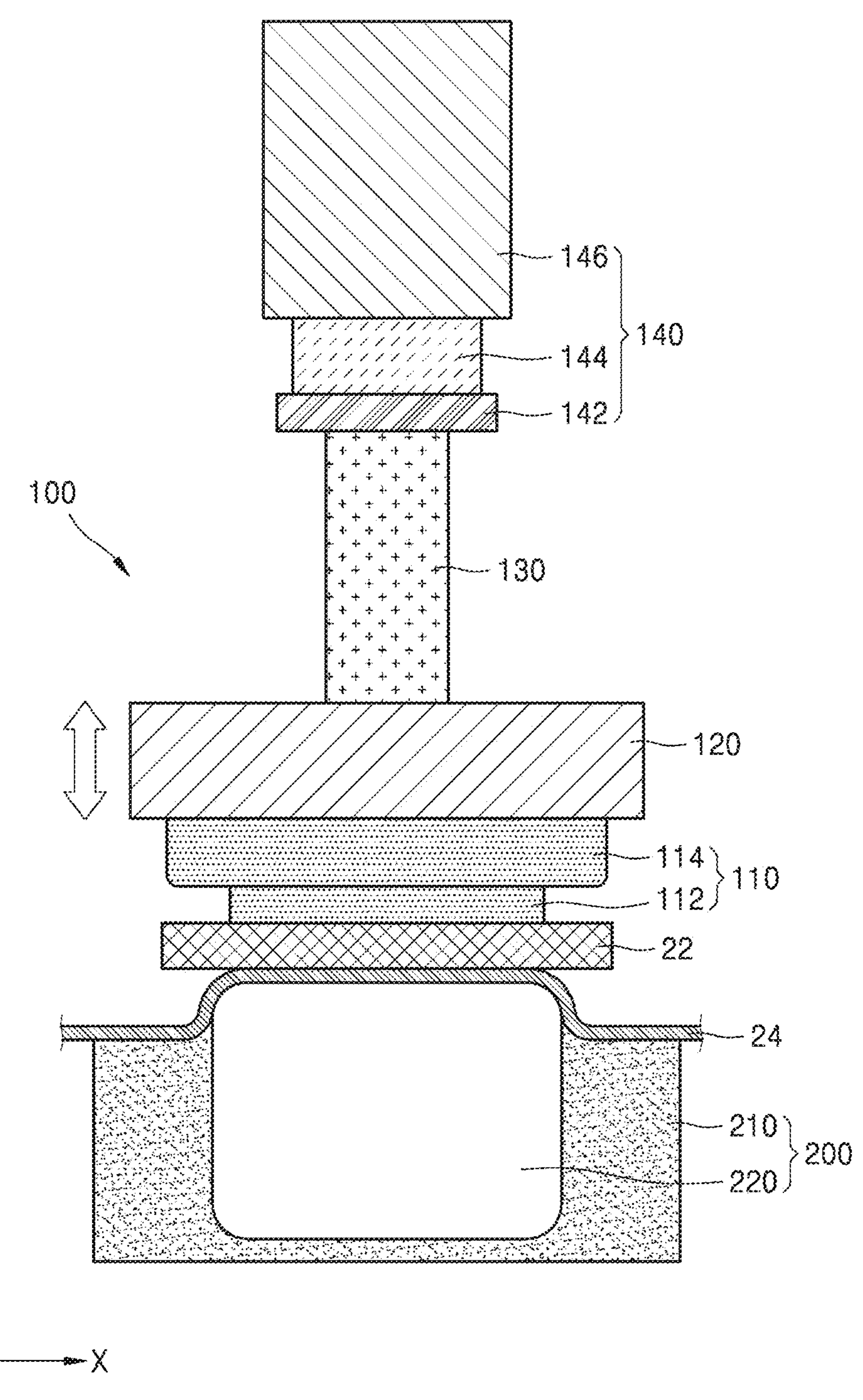

Referring to FIGS. 4 and 5B, after the collet 110 is coupled to the chip 22, the lifting block 220 of the ejector stage 200 may lift upwards, and the chip pick-up head 100 may vibrate (S150). The lifting block 220 may lift in a direction substantially perpendicular to the top surface of the chip 22, that is, in a third direction (Z direction). The chip pick-up head 100 may also vibrate in the third direction (Z direction). In addition, the head part 120 and the collet 110 may be vibrated in the third direction (Z direction) due to the vibration of the chip pick-up head 100 in the third direction (Z direction).

The chip pick-up head 100 may be vibrated while increasing in height in the third direction (Z direction). Accordingly, the head part 120 and the collet 110 may also be vibrated while increasing in height in the third direction (Z direction). In addition, the lifting block 220 may be vibrated while increasing in height in the third direction (Z direction) according to the heights of the head part 120 and the collet 110.

For example, in the chip detachment method of an embodiment, the height of the head part 120 and the collet 110 may increase in the third direction (Z direction) in repeating the lifting and moving down of the head part 120 and the collet 110. For example, according to an embodiment, the height of the lower surface of the collet 110 is changed as follows: about 0 μm→about 60 μm→about 40 μm→about 100 μm→about 80 μm→, . . . →about 540 μm→about 600 μm, so that the height of the lower surface of the collet 110 increases in repeating the lifting and moving down of the collet 110. Depending on the size of the vibration, the height of the lifting and moving down may be variously changed.

As the chip 22 is adsorbed onto the collet 110 by the vacuum pressure and the chip 22, and the adhesive film 24 are also adsorbed onto the ejector stage 200 by the vacuum pressure, the lifting block 220 may be vibrated and lifted corresponding to the height of the collet 110. In addition, as described above with reference to the collet 110, the height of the upper surface of the lifting block 220 may also increase in repeating the lifting and moving down. The height increase of the head part 120 and the collet 110 in repeating the lifting and moving down and the height increase of the lifting block 220 in repeating the lifting and moving down are described in more detail below with reference to FIGS. 7A and 7B.

Figure 5C:
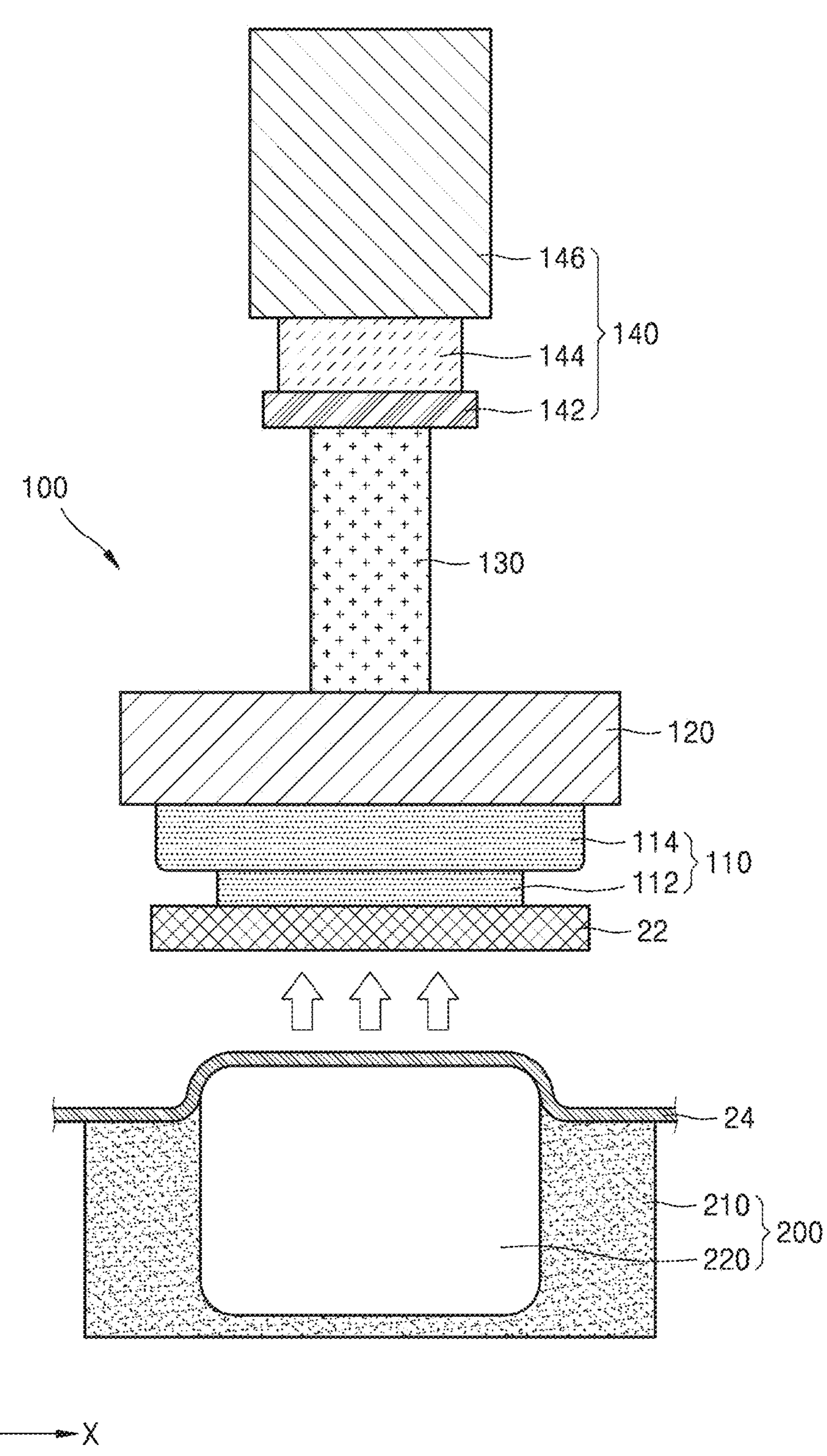

Referring to FIGS. 4 and 5C, thereafter, the chip pick-up head 100 may detach and pick up the chip 22 from the adhesive film 24 (S170). For example, the chip pick-up head 100 may continue to lift, and accordingly, the heights of the collet 110 and the chip 22 may continue to increase. In contrast, according to embodiments, the lifting block 220 is not lifted over a preset maximum height. Accordingly, as indicated by the arrows in FIG. 5C, the chip 22 may be detached from the adhesive film 24 and picked up by the chip pick-up head 100.

After the chip pick-up head 100 picks up the chips 22, the lifting block 220 of the ejector stage 200 may move down to its original position. For example, the lifting block 220 may linearly and continuously move down to the position of the base block 210. After moving down the lifting block 220, the ejector stage 200 may move to another position under the chip 22 to be picked up next.

Figure 5D:
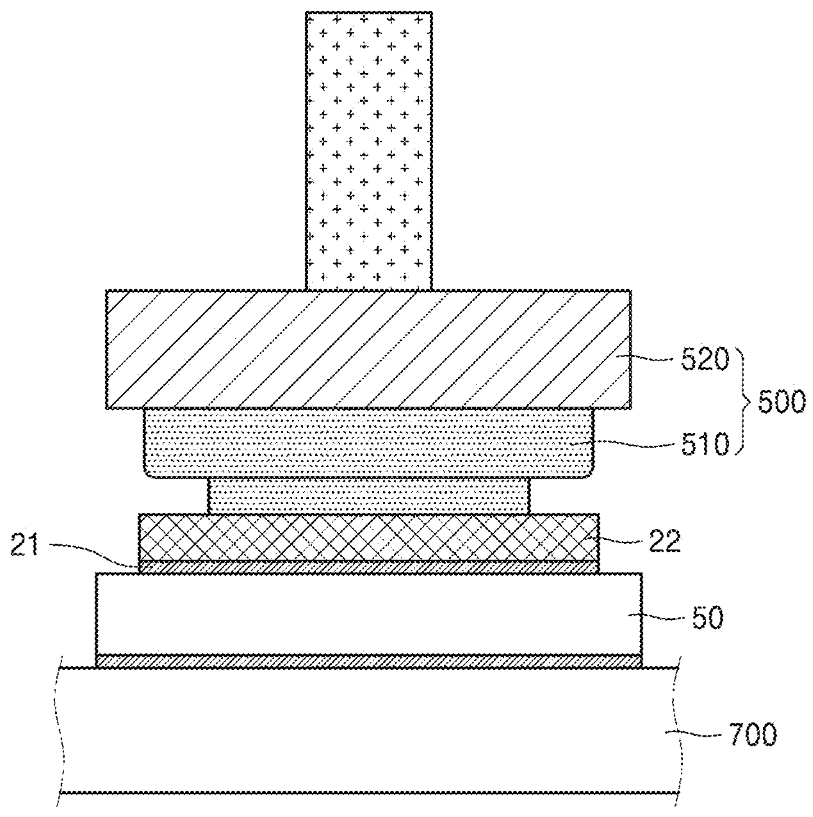

Referring to FIG. 5D, after picking up the chip 22, the chip pick-up head 100 may be turned over in such a manner that the chip 22 faces upwards, as shown in FIG. 2. In addition, the chip bonding head 500 may receive the chip 22 from the chip pick-up head 100. For example, the chip bonding head 500 may include a head part 520 and a collet 510. The collet 510 may include a plurality of fine vacuum holes. Accordingly, the vacuum pressure may be applied to the chip 22 through the vacuum holes, and the chip 22 may be adsorbed onto the collet 510 by the vacuum pressure. When the chip 22 is transferred from the chip pick-up head 100 to the chip bonding head 500, vacuum adsorption is performed on the collet 510 of the chip bonding head 500, and vacuum adsorption of the collet 110 of the chip pick-up head 100 may be released.

The chip bonding head 500 may bond the chip 22 onto a substrate 700 such as, for example, a lead frame, a printed circuit board, or a semiconductor wafer. In addition, the chip bonding head 500 may bond the chip 22 onto another chip 50 as shown in FIG. 5D. The chip 22 and the other chip 50 may be the same type of chip or different types of chip. Bonding of the chip 22 to the substrate 700 or another chip 50 may be performed by a die attach film (DAF) 21 attached to a lower surface of the chip 22.

In the chip detachment method of an embodiment, the chip 22 detached and picked up by the chip detachment apparatus 1000 may include a memory chip and a logic chip. The memory chip may include a plurality of memory devices, such as, for example, dynamic random access memory (DRAM) devices, static random access memory (SRAM) devices, flash memory devices, electrically erasable and programmable read-only memory (EEPROM) devices, phase-change random access memory (PRAM) devices, magnetic random access memory (MRAM) devices, and resistive random access memory (RRAM) devices. In addition, the logic chip may include a plurality of logic devices, such as, for example, AND devices, NAND devices, OR devices, NOR devices, exclusive OR (XOR) devices, exclusive NOR (XNOR) devices, inverter (INV) devices, adder (ADD) devices, delay (DLY) devices, multiplexer (MXT/MXIT) devices, OAI (OR/AND/INVERTER) devices, AO (AND/OR) devices, AOI (AND/OR/INVERTER) devices, D flip-flop devices, reset flip-flop devices, master-slaver flip-flop devices, latch devices, counter devices, and buffer devices. In addition, the logic chip may include, for example, a central processing unit (CPU), a micro-processor unit (MPU), a graphic processing unit (GPU), and an application processor (AP) chip.

The chip bonding process may be performed by the chip bonding head 500 in such a manner that the chip 22 is bonded to the substrate 700 or another chip 50, to thereby complete the die attach process of the chip 22.

Figure 6A:
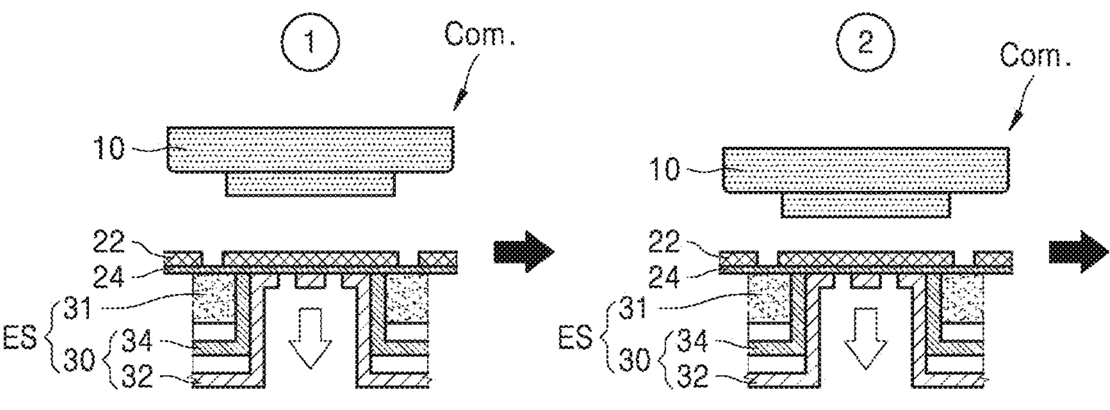
FIGS. 6A and 6B are respectively a conceptual view and a corresponding graph of a chip detachment method using a chip detachment apparatus of a comparative example.
Figure 6A:
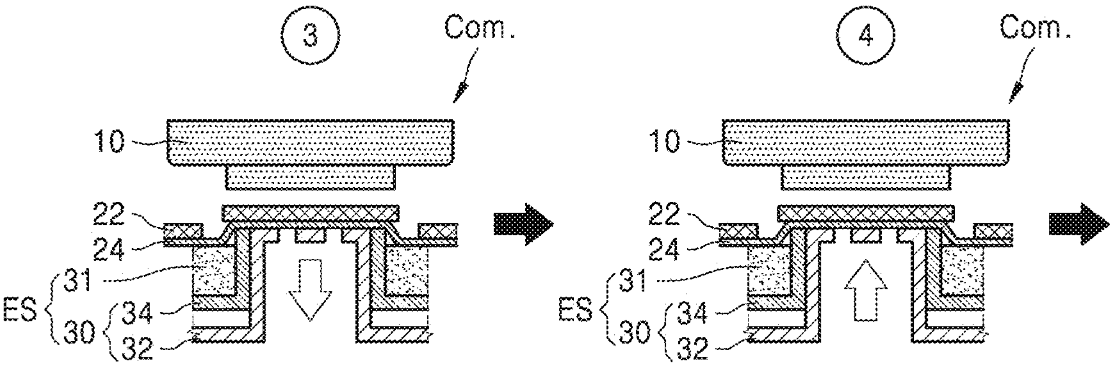
Figure 6A:
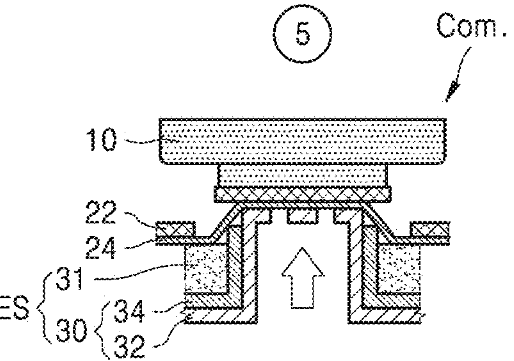
Figure 6B:
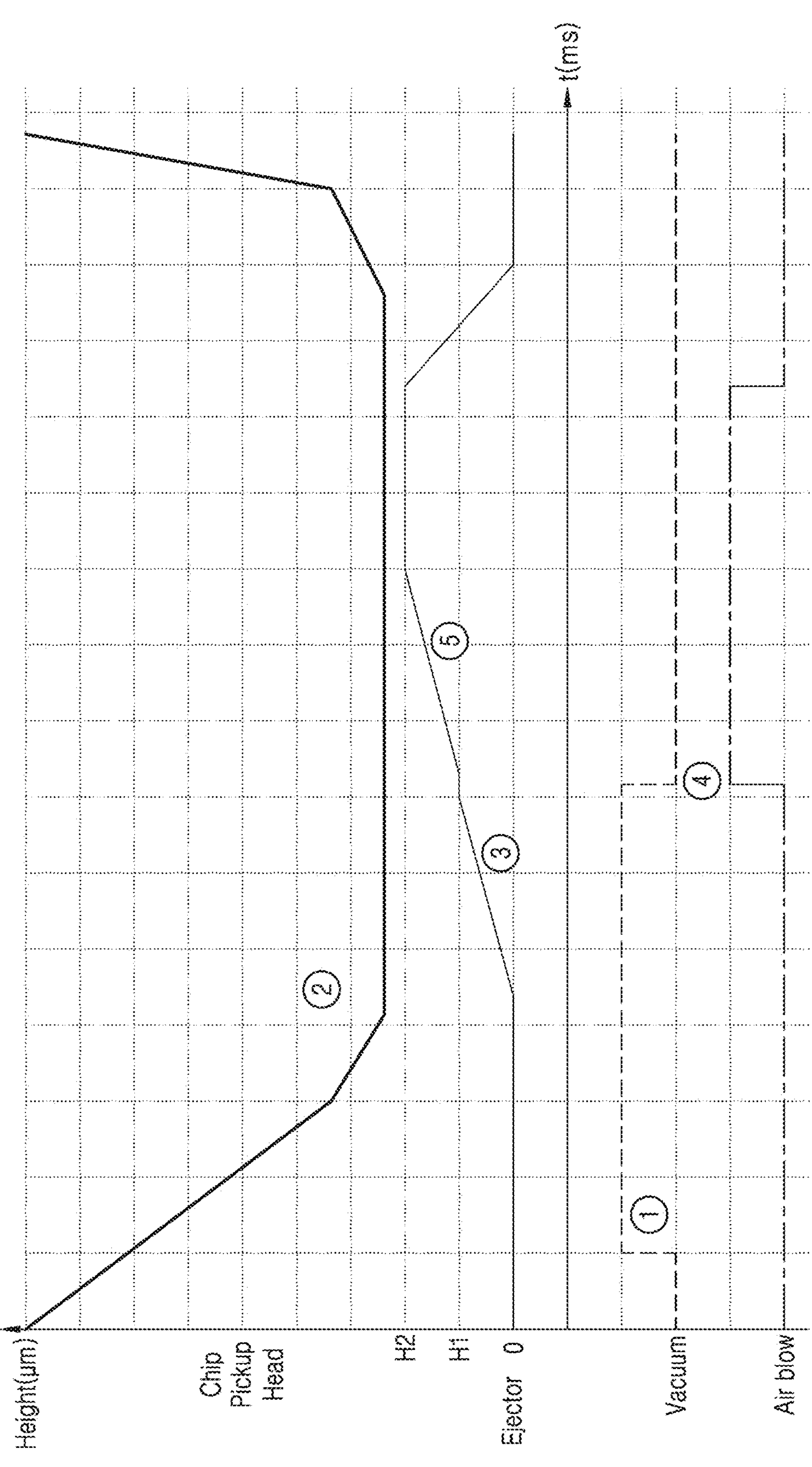

FIGS. 6A and 6B are respectively a conceptual view and a corresponding graph of a chip detachment method using a chip detachment apparatus of a comparative example.

FIG. 6A shows sequential processes of a method of detaching and picking up a chip 22 in the chip detachment apparatus (Com.) of the comparative example.

FIG. 6B is a graph showing the heights of the chip pick-up head and the ejector and on/off of vacuum and air blow (e.g., blowing air on the chip) for each time interval according to each process of the method of detaching and picking up a chip shown in FIG. 6A.

In the graph of FIG. 6B, the x-axis represents time in a unit of milliseconds (ms), and the y-axis represents height in a unit of μm. In addition, the y-axis indicates an on and off state of the vacuum and the air blow in the case of the vacuum and the air blow.

Referring to FIGS. 6A and 6B, in a method of detaching and picking up a chip by using the chip detachment apparatus of a comparative example (hereinafter referred to as the 'comparative chip detachment method'), a chip 22 to be picked up is adsorbed onto the ejector stage ES by the vacuum pressure in operation ①. In operation ① of FIG. 6A, an arrow pointing downward indicates the adsorption by the vacuum pressure (referred to as vacuum adsorption). The vacuum adsorption may be performed on the chip 22 and the portion of the adhesive film 24 on which the chip 22 is positioned. As shown in the graph of FIG. 6B, the vacuum pressure is applied to the chip 22 and the vacuum is turned on at a start point of operation ①, so that the vacuum adsorption is performed by the ejector stage ES.

In the beginning of operation ①, the chip pick-up head 10 may be positioned apart from the chip 22 by a certain distance. In addition, the ejector 30 or the lifting block of the ejector stage ES may be positioned at the same height as the base block 31.

Next, in operation ②, the chip pick-up head 10 moves downwards. As the chip pick-up head 10 moves downward, a lower surface of the collet of the chip pick-up head 10 comes closer to the chip 22. In operation ②, as the vacuum is still maintained as the on state, the vacuum adsorption by the ejector stage ES is also kept on. In operation ②, the ejector 30 is still positioned at the same height as the base block 31.

In operation ③, the ejector 30 is lifted to the first height H1. The first height H1 may be, for example, about 300 μm. However, the first height H1 is not limited to about 300 μm. Herein, the first height H1 may be a height in a vertical direction from an upper surface of the base block 31.

The ejector 30 includes a first block 32 and a second block 34, and in operation ③, the entire ejector 30, that is, both of the first block 32 and the second block 34, is linearly lifted to the first height H1. In operation ③, the vacuum is still maintained as the on state, and thus, the vacuum adsorption by the ejector stage ES is continuously maintained.

In operation ④, the vacuum is turned off and the air blow is turned on. Air is supplied toward the chip 22 as the air blow indicated as an arrow pointing upward in operation ④ in FIG. 6A. In addition, the graph in FIG. 6B indicates that the vacuum is turned off and the air blow is turned on at the beginning of operation ④. At the beginning of operation ④, the first block 32 of the ejector 30 starts to lift.

In operation ⑤, the first block 32 of the ejector 30 is lifted to the second height H2. The second height H2 may be, for example, about 600 μm. However, the second height H2 is not limited to about 600 μm. As shown in the graph of FIG. 6B, the lift of the first block 32 in operation ⑤ starts from the beginning of operation ④.

As the first block 32 of the ejector 30 is lifted to the second height H2, the chip 22 is lifted to such a height that the chip 22 makes close contact with a lower surface of the collet of the chip pick-up head. Then, the vacuum adsorption is performed by the collet.

Thereafter, the ejector 30 moves downwards and the chip 22 is detached from the adhesive film 24, and accordingly, the chip 22 is picked up by the chip pick-up head 10. As shown in the graph of FIG. 6B, the air blow is turned off when the ejector 30 moves downward.

Thereafter, the lifting of the chip pick-up head 10, the turning over of the chip pick-up head 10, the transfer of the chip 22 to the chip bonding head, and the bonding of the chip 22 to a substrate or another chip by the chip bonding head are sequentially performed.

The chip detachment method of the comparative example is performed by five operations as described above. According to the chip detachment method of this comparative example, a large stress is applied to the chip 22, and thus, cracks are likely to occur in the chip 22 due to the large stress, as is described in the descriptions with reference to FIGS. 8A to 10B. As a result, the reliability of the chip 22 may be reduced, and a defect or a decrease in reliability may occur in a semiconductor package or electronic product including the chip 22.

Figure 7A:
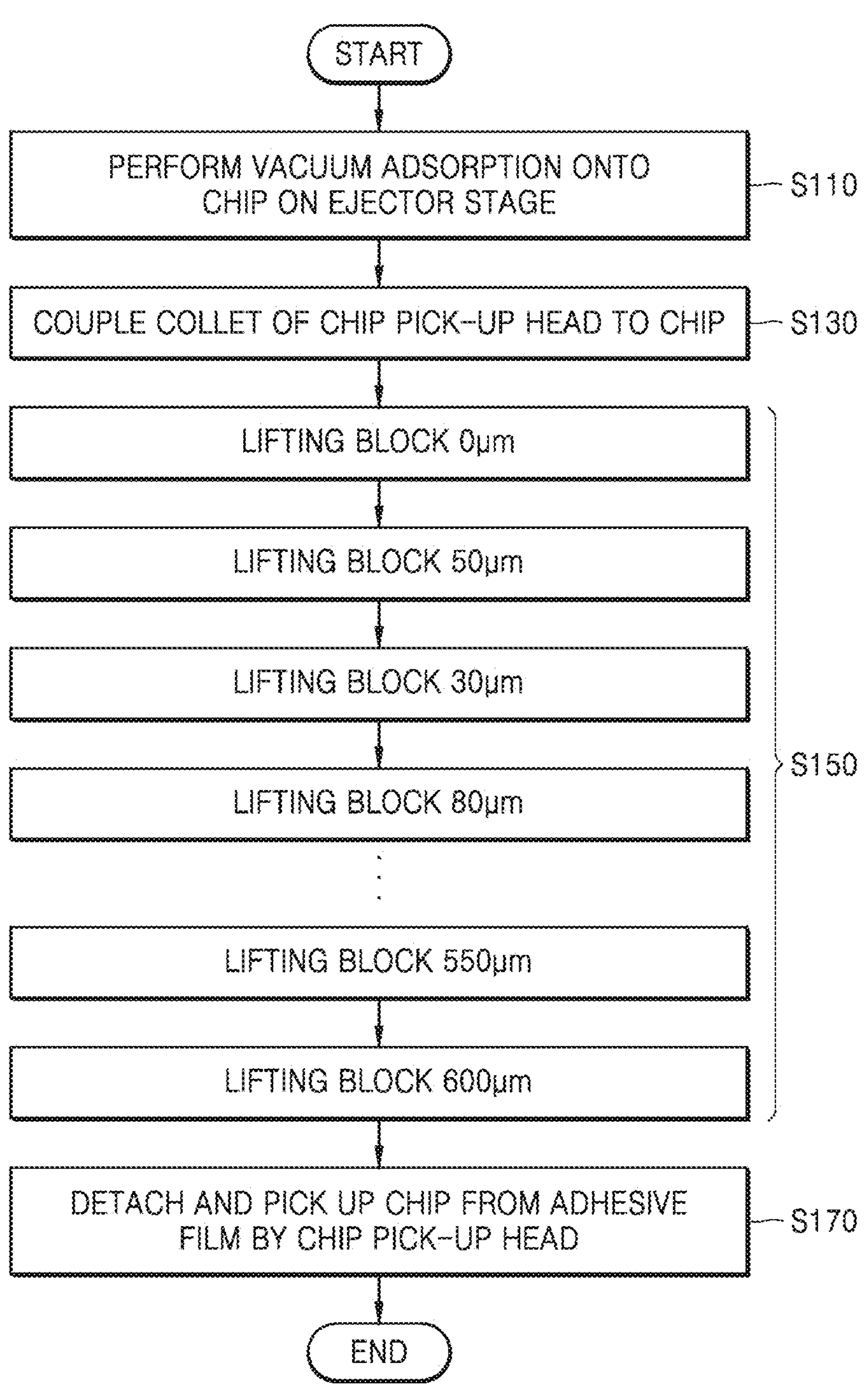
FIGS. 7A and 7B are respectively a flowchart and a graph showing the processes of the chip detachment method in FIG. 4 according to an embodiment.
Figure 7B:
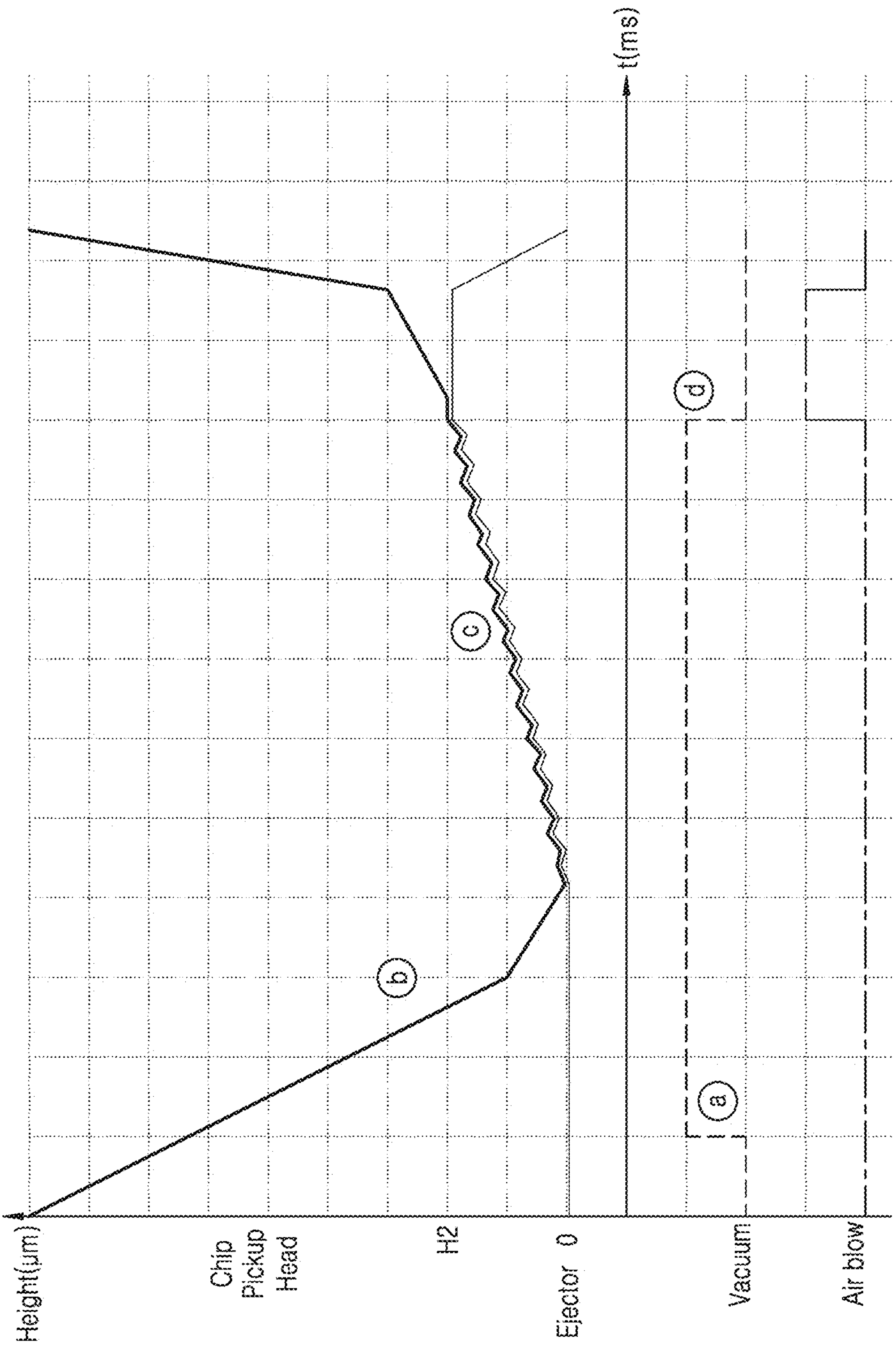

FIGS. 7A and 7B are a flowchart showing the processes of the chip detachment method in FIG. 4 in more detail, and a graph corresponding to the processes of the chip detachment method in FIG. 4, respectively.

In the graph of FIG. 7B, the x-axis represents time in a unit of milliseconds (ms), and the y-axis represents height in a unit of μm. In addition, the y-axis indicates an on or off state of the vacuum and the air blow in the case of the vacuum and the air blow. The chip detachment method in FIG. 4 is described with reference to FIGS. 7A and 7B together with FIGS. 3A, 3B and 5A to 5D. For convenience of explanation, a further description of components and technical aspects previously described with reference to FIGS. 1 to 5D are only briefly given or omitted.

Referring to FIGS. 7A and 7B, in the chip detachment method of an embodiment, the chip 22 to be picked up may be adsorbed onto the ejector stage 200 by the vacuum pressure in operation ⓐ. Operation ⓐ may correspond to an operation of performing the vacuum adsorption S110 in FIG. 7A. In addition, as shown in the graph of FIG. 7B, the vacuum may be turned on at the beginning of operation ⓐ. The chip pick-up head 100 may maintain a certain distance from the chip 22 at an initial point of operation ⓐ. In addition, the lifting block 220 of the ejector stage 200 may be positioned at the same height as the base block 210. In the graph of FIG. 6B, the lifting block 220 may indicate the ejector.

Next, in operation ⓑ, the chip pick-up head 100 may move downwards, and the collet 110 of the chip pick-up head 100 may come into close contact with the upper surface of the chip 22. In addition, the vacuum adsorption may be performed in the collet 110, and the chip 22 may be adsorbed to the collet 110 by the vacuum pressure. Operation ⓑ corresponds to an operation S130 in which the collet 110 is coupled to the chip in FIG. 7A, as is illustrated in FIG. 5A.

In operation ⓑ, the vacuum is maintained on, and thus, the vacuum adsorption by the ejector stage 200 may be maintained. In addition, in operation ⓑ, the lifting block 220 may still be positioned at the same height as the base block 210.

In operation ⓒ, the chip pick-up head 100 may be lifted with vibrating, and the lifting block 220 of the ejector stage 200 may also be lifted with vibrating. Operation ⓒ corresponds to operation S150 in FIG. 7A in which the chip pick-up head 100 vibrates, as is illustrated in FIG. 5B.

As shown in the graph of FIG. 7B, in operation ⓒ, as the vacuum is still maintained on, the vacuum adsorption by the ejector stage 200 may be maintained. In addition, the lifting block 220 may be continuously lifted from the height of the base block 210 to the second height H2 in a quasi-linear form. The second height H2 may be, for example, about 600 μm. However, the second height H2 is not limited to about 600 μm. Herein, the quasi-linear form indicates that a graph of height over time is shown in a linear form with a regular ripple, as shown in the graph in FIG. 7B. Herein, the ripple is generated by the vibrations, as described above.

Based on the structure of the lifting block 220, the lifting block 220 may be lifted to a middle height, for example, the first height H1 in FIG. 6B, in the quasi-linear form integrally with the first block 222 and the second block 224, and then, the first block 222 may be lifted to the second height H2 from the first height H1 in the quasi-linear form.

In FIG. 7A, the height of the lifting block 220 may be exemplarily changed as follows: about 0 μm→about 50 μm→about 30 μm→about 80 μm→about 60 μm→, . . . →about 550 μm→about 600 μm. Herein, about 50 μm, about 80 μm, about 600 μm, etc. may be heights when the lifting block 220 is lifted, and about 30 μm, about 60 μm, and about 550 μm may be heights when the lifting block 220 moves down (or descends). That is, the lifting block 220 may be lifted by a unit of about 50 μm, and move down by a unit of about 20 μm. This may be the result of the lifting block 220 being lifted at a constant speed. The lifting heights and the descent heights of the lifting block 220 with vibration are not be limited to the above-mentioned values and may be varied according to embodiments.

In operation ⓓ, the chip pick-up head 100 continues to rise, but the vibration of the chip pick-up head 100 is stopped. In addition, the lifting of the lifting block 220 is stopped. Thereafter, as the chip pick-up head 100 moves upward and the lifting block 220 moves downward, the chip 22 is detached from the adhesive film 24, and accordingly, the chip 22 may be picked up by the chip pick-up head 100.

Operation ⓓ corresponds to operation S170 in FIG. 7A in which the chip 22 is detached and picked up, as is illustrated in FIG. 5C. As shown in the graph of FIG. 7B, in operation ⓓ, the vacuum may be turned off and the air blow may be turned on. The air blow may be turned off at a part where the lifting block 220 moves down. For example, the detachment of the chip 22 from the adhesive film 24 may be performed in a section in which the air blow is on. However, according to embodiments, the chip 22 may be detached from the adhesive film 24 after the air blow is turned off.

Thereafter, the lifting of the chip pick-up head 100, the turning over of the chip pick-up head 100, the transfer of the chip 22 to the chip bonding head 500, and the bonding of the chip 22 to the substrate 700 or another chip 50 by the chip bonding head 500 may be sequentially performed.

Figures 8A, 8B:
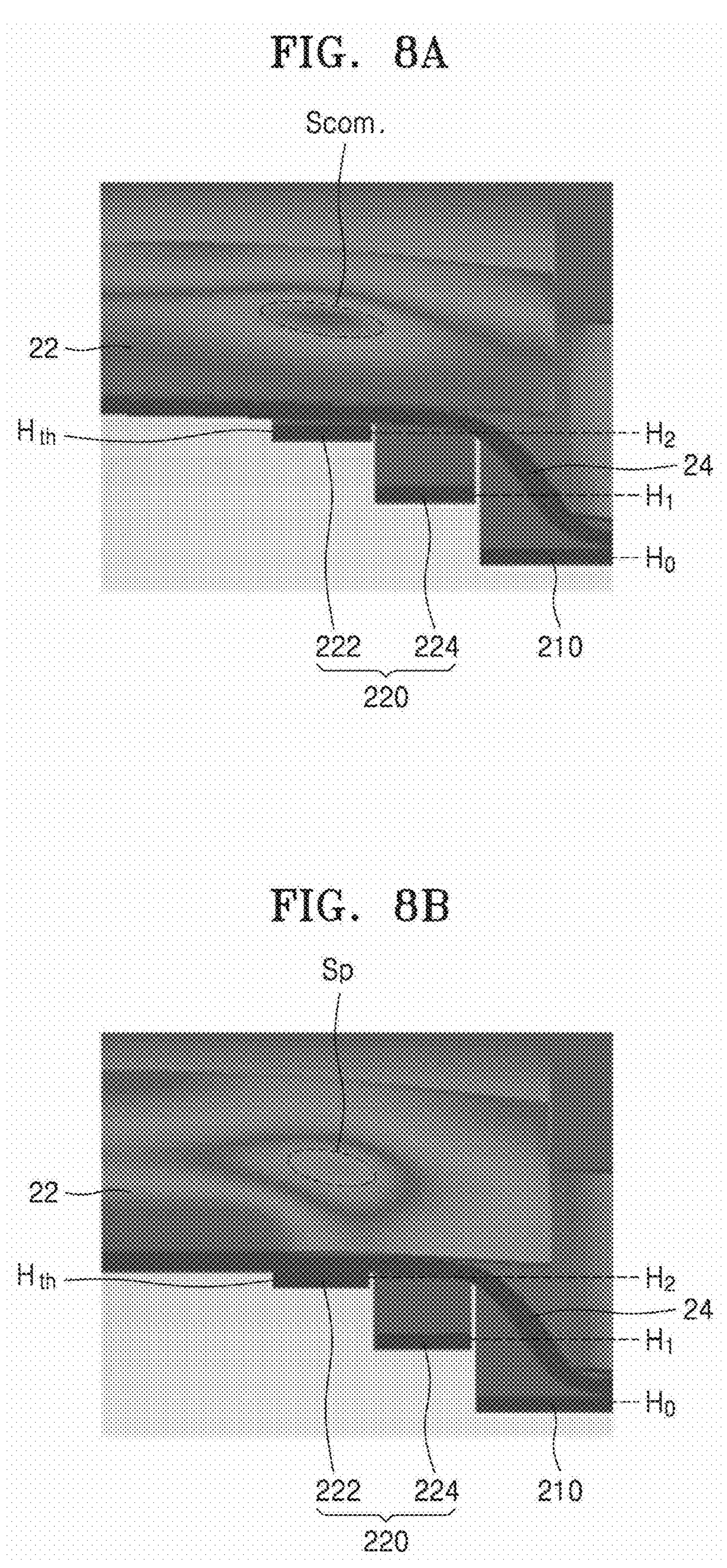
FIGS. 8A and 8B are simulation pictures showing stress applied to chips in performing the chip detachment method by the chip detachment apparatus of a comparative example and by the chip detachment apparatus of an embodiment according to FIG. 1, respectively.

FIGS. 8A and 8B are simulation pictures showing stress applied to chips in performing the chip detachment method by the chip detachment apparatus of the comparative example, and by the chip detachment apparatus according to an embodiment of FIG. 1 in which the stresses are measured just before the chip 22 is detached from the adhesive film 24, respectively.

Referring to FIGS. 8A and 8B, high stress Scom. occurs in a portion of the chip 22 corresponding to the first block 222 of the lifting block 220 in the chip detachment method by the chip detachment apparatus of the comparative example, as shown in FIG. 8A. On the contrary, relatively low stress Sp occurs in a portion of the chip corresponding to the first block 222 of the lifting block 220 in the chip detachment method by the chip detachment apparatus of an embodiment, as shown in FIG. 8B.

For example, FIGS. 8A and 8B are pictures obtained by performing a black-and-white process to photographs in which the stresses are shown in colors in such a way that the stress increases as a red color is reached and decreases as a blue color is reached. When the color is processed to black-and-white, the red color and the blue color may be changed to black, and an intermediate color, such as a yellow color, may be changed to white. In FIG. 8A, the black of the stress Scom. actually corresponds to the red color and shows that the stress is high. On the other hand, in FIG. 8B, the gray color of the stress Sp corresponds to a degree of an orange color, showing that the stress is relatively low.

Figure 9B:
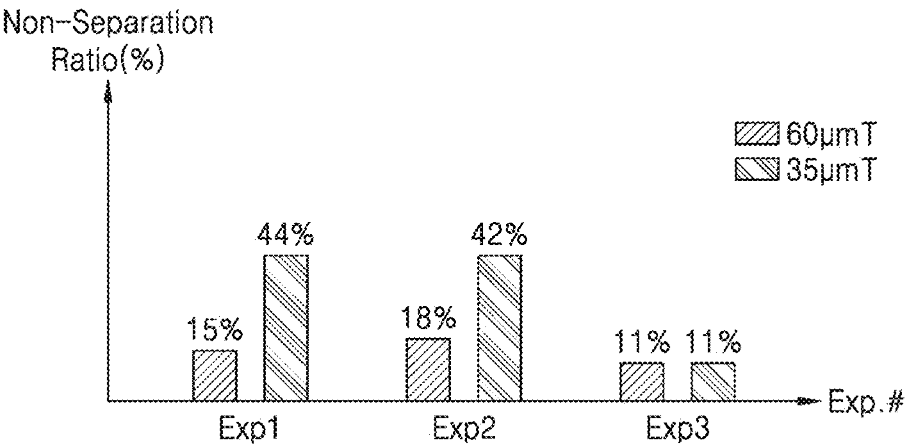

FIGS. 9A and 9B are tables and graphs showing non-separation ratios of chips in a comparative evaluation of the chip detachment method by the chip detachment apparatus of the comparative example, and the chip detachment method by the chip detachment apparatus according to an embodiment of FIG. 1, respectively. Herein, the non-separation indicates that the adhesive film 24 is not fully removed from the chip 22. In the graph of FIG. 9B, the x-axis represents the type of experiment, and the y-axis represents the non-separation ratio.

Referring to FIGS. 9A and 9B, and more particularly, to the contents of the table in FIG. 9A, Exp1 and Exp2 correspond to the chip detachment method of comparative examples, and the ejector time of Exp1 is set to be different from that of Exp2. For example, the ejector's descending time of Exp1 is set to be about 240 ms, and the ejector's descending time of Exp2 is set to be about 150 ms. Exp3 corresponds to the chip detachment method of an embodiment, and the ejector time of Exp3 is set to be about 150 ms identical to that of Exp2. The heights of the ejectors in Exp1, Exp2 and Exp3 are set identically to be about 250 μm. In addition, the evaluation was performed on a chip having a thickness of about 60 μm and a chip having a thickness of about 35 μm, and the evaluation was repeated on two hundred samples for each chip.

As shown in the table of FIG. 9A, in the chip having a thickness of about 60 μm, the numbers of undetached chips in Exp1 and Exp2 were 29 and 36, respectively, and the non-separation ratio of Exp1 and Exp2 were 15% and 18%, respectively. On the contrary, the number of undetached chips in Exp3 was 21, and the non-separation ratio of Exp3 was 11%. On the other hand, in the chip having a thickness of about 35 μm, the numbers of undetached chips in Exp1 and Exp2 were 88 and 84, respectively, and the non-separation ratio of Exp1 and Exp2 were 44% and 42%, respectively. On the contrary, the number of undetached chips in Exp3 was 22, and the non-separation ratio of Exp3 was 11%. Accordingly, the comparative evaluation confirms that the number of undetached chips and the non-separation ratio are sufficiently smaller in the chip detachment method of an embodiment than in the chip detachment method of the two comparative examples.

For example, the smaller the thickness of the chip 22 is, the more flexible the chip 22 is, and thus, the higher the non-separation ratio of the chip is. Accordingly, in the case of Exp1 and Exp2, the non-separation ratio may greatly increase in the chip 22 having a thickness of about 35 1.™ compared to the chip 22 having a thickness of about 60 μm. In contrast, in the chip detachment method of an embodiment, the comparative evaluation confirms that the non-separation ratio is similarly low in the chip 22 having a thickness of about 60 μm and the chip having a thickness of about 35 μm.

Figure 10B:
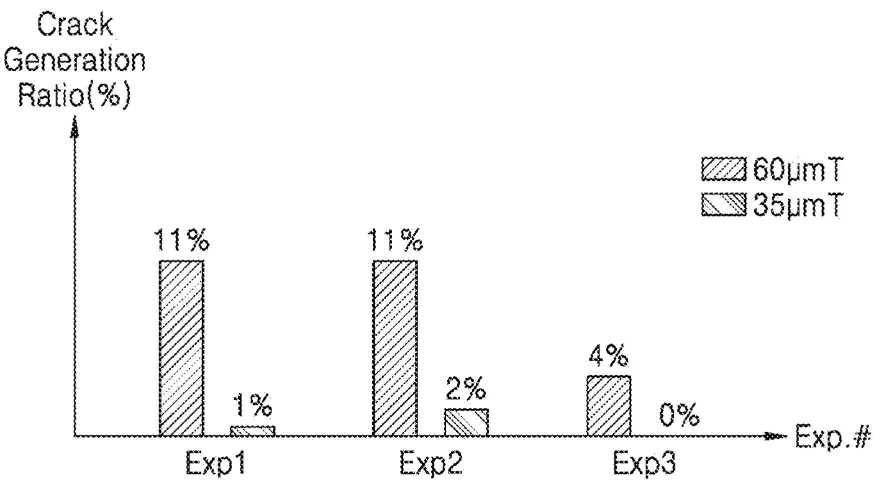

FIGS. 10A and 10B are a table and a graph showing crack generation ratios of chips in a comparative evaluation of the chip detachment method by the chip detachment apparatus of the comparative example, and the chip detachment method by the chip detachment apparatus according to an embodiment of FIG. 1, respectively. In the graph of FIG. 10B, the x-axis represents the type of experiment, and the y-axis represents the crack generation ratio of a chip.

Referring to FIGS. 10A and 10B, and more particularly, to the contents of the table in FIG. 10A, Exp1 and Exp2 correspond to the chip detachment method of comparative examples, and the ejector time of Exp1 is set to be different from that of Exp2. For example, the ejector's descending time of Exp1 is set to be about 240 ms, and the ejector's descending time of Exp2 is set to be about 150 ms. Exp3 corresponds to the chip detachment method of an embodiment, and the ejector time of Exp3 is set to be about 150 ms identical to that of Exp2. The heights of the ejectors in Exp1, Exp2 and Exp3 are set identically to be about 600 μm. In addition, the evaluation was performed on a chip having a thickness of about 60 μm and a chip having a thickness of about 35 μm, and the evaluation was repeated on two hundred samples for each chip.

As shown in the table of FIG. 10A, in the chip having a thickness of about 60 μm, the numbers of crack chips in Exp1 and Exp2 were identically 21, and the crack generation ratios of Exp1 and Exp2 were identically 11%. On the contrary, the number of crack chips in Exp3 was 7, and the crack generation ratio of Exp3 was 4%. On the other hand, in a chip having a thickness of about 35 μm, the numbers of crack chips of Exp1 and Exp2 area 1 and 3, respectively, and the crack generation ratios of Exp1 and Exp2 were 1% and 2%, respectively. In contrast, the number of crack chips in Exp3 was 0, and the crack generation ratio of Exp3 was 0%. Accordingly, the comparative evaluation confirms that the number of crack chips and the crack generation ratio are sufficiently smaller in the chip detachment method of an embodiment than in the chip detachment method of the two comparative examples.

For example, the smaller the thickness of the chip 22 is, the more flexible the chip 22 is, and thus, the lower the crack generation ratio of the chip is. Accordingly, in the case of Exp1 and Exp2, the crack generation ratio may greatly decrease in the chip 22 having a thickness of about 35 μm compared to the chip 22 having a thickness of about 60 μm. In contrast, in the chip detachment method of an embodiment, the comparative evaluation confirms that the crack generation ratio of the chip having a thickness of about 60 μm is relatively low at about 4%, and the crack generation ratio of the chip having a thickness of 35 μm is 0% without any cracks in the chip.

While the inventive concept has been particularly shown and described with reference to embodiments thereof, it will be understood that various changes in form and details may be made therein without departing from the spirit and scope of the inventive concept as defined by the following claims.

What is claimed is:

1. A chip pick-up head, comprising:

a collet in contact with an upper surface of a chip of a diced wafer, wherein the chip pick-up head detaches and picks up the chip from an adhesive film;

a head part coupled to the collet;

a vibration transfer rod coupled to the head part and configured to transfer a vibration to the head part and the collet; and a vibration generator coupled to the vibration transfer rod and configured to generate the vibration, wherein the vibration generator generates the vibration in a frequency range of about 1 Hz to about 500 Hz.

2. The chip pick-up head of claim 1, wherein when the chip pick-up head detaches and picks up the chip, the chip is secured onto the collet by vacuum adsorption, and the head part and the collet are configured to vibrate in a vertical direction substantially perpendicular to the upper surface of the chip.

3. The chip pick-up head of claim 2, wherein the collet includes a pad having a plurality of vacuum holes, and when the chip pick-up head detaches and picks up the chip, the pad makes contact with the upper surface of the chip and secures the chip onto the collet by the vacuum adsorption through the vacuum holes.

4. The chip pick-up head of claim 1, wherein the vibration generator includes an actuator that electrically generates the vibration.

5. The chip pick-up head of claim 1, wherein when the chip pick-up head detaches and picks up the chip, the head part and the collet vibrate while respective heights of the head part and the collet increase.

6. A chip detachment apparatus, comprising:

a wafer stage that supports a diced wafer attached to an adhesive film;

an ejector stage positioned under the adhesive film and including a lifting block configured to push a chip to be picked up from the wafer, together with the adhesive film; and a chip pick-up head configured to detach and pick up the chip from the adhesive film by vacuum adsorption and vibration, wherein the chip pick-up head includes a vibration generator configured to generate the vibration, and wherein the vibration generator generates the vibration in a frequency range of about 1 Hz to about 500 Hz.

7. The chip detachment apparatus of claim 6, wherein the chip pick-up head includes:

a collet configured to make contact with an upper surface of the chip when the chip is detached and picked up by the chip pick-up head;

a head part coupled to the collet; and a vibration transfer rod coupled to the head part and configured to transfer the vibration to the head part and the collet.

8. The chip detachment apparatus of claim 7, wherein when the chip pick-up head detaches and picks up the chip, the chip is secured onto the collet by the vacuum adsorption, and the head part and the collet are configured to vibrate in a vertical direction substantially perpendicular to the upper surface of the chip.

9. The chip detachment apparatus of claim 7, wherein the vibration generator includes an actuator that electrically generates the vibration.

10. The chip detachment apparatus of claim 7, wherein when the chip pick-up head detaches and picks up the chip, the head part and the collet are configured to vibrate while respective heights of the head part and the collet increase.

11. The chip detachment apparatus of claim 6, wherein the ejector stage includes:

a central open area, the lifting block surrounding the central open area, and a base block surrounding the lifting block, and the lifting block includes:

a first block surrounding the central open area; and a second block surrounding the first block.

12. The chip detachment apparatus of claim 11, wherein when the chip pick-up head detaches and picks up the chip, at least one of the vacuum adsorption and an air blow is performed on the chip through the open area, and after the first block and the second block are lifted from a base height to a first height, the first block is lifted to a second height.

13. The chip detachment apparatus of claim 12, wherein the lift to the first height from the base height and the lift to the second height from the first height are performed continuously in a quasi-linear form with a regular ripple.

14. A chip detachment apparatus, comprising:

a wafer stage that supports a diced wafer attached to an adhesive film;

an ejector stage positioned under the adhesive film and including a lifting block configured to push a chip to be picked up from the wafer, together with the adhesive film; and a chip pick-up head including:

a collet in contact with an upper surface of the chip;

a head part coupled to the collet; and a vibration generator configured to generate a vibration and transfer the vibration to the head part and the collet, wherein the vibration generator generates the vibration in a frequency range of about 1 Hz to about 500 Hz.

15. The chip detachment apparatus of claim 14, wherein when the chip pick-up head detaches and picks up the chip, the chip is secured onto the collet by vacuum adsorption, and the head part and the collet are configured to vibrate in a vertical direction substantially perpendicular to the upper surface of the chip.

16. The chip detachment apparatus of claim 14, wherein the chip pick-up head further includes:

a vibration transfer rod positioned between the head part and the vibration generator, and configured to transfer the vibration to the head part and the collet, wherein the vibration generator includes an actuator that electrically generates the vibration.

17. The chip detachment apparatus of claim 14, wherein when the chip pick-up head detaches and picks up the chip, the head part and the collet vibrate while respective heights of the head part and the collet increase, and a height of the lifting block increases in correspondence with the height of the collet.

18. The chip detachment apparatus of claim 14, wherein the ejector stage includes:

a central open area, the lifting block surrounding the central open area, and a base block surrounding the lifting block, the lifting block includes:

a first block surrounding the central open area and a second block surrounding the first block, and wherein when the chip pick-up head detaches and picks up the chip from the wafer, after the first block and the second block are lifted from a base height to a first height, the first block is continuously lifted from the first height to a second height in a quasi-linear form.

* * * * *